United States Patent [19]

Hynecek

[11] Patent Number: 5,142,346
[45] Date of Patent: Aug. 25, 1992

[54] FLOATING GATE JFET IMAGE SENSOR

[75] Inventor: Jaroslav Hynecek, Richardson, Tex.

[73] Assignee: Texas Instruments Incorporated, Dallas, Tex.

[21] Appl. No.: 318,456

[22] Filed: Mar. 1, 1989

Related U.S. Application Data

[63] Continuation of Ser. No. 34,306, Apr. 3, 1987, abandoned.

[51] Int. Cl.$^5$ .................... H01L 27/14; H01L 29/80; H01L 29/78
[52] U.S. Cl. ........................ 357/30; 357/22; 357/24; 377/60
[58] Field of Search ................ 357/22 B, 24 LR, 45, 357/30 D, 30 G, 30 H, 30 I; 377/60

[56] References Cited

U.S. PATENT DOCUMENTS

| 4,148,046 | 4/1979 | Hendrickson et al. | 357/42 |
|---|---|---|---|
| 4,240,093 | 12/1980 | Dingwall | 357/42 |
| 4,273,805 | 6/1981 | Dawson et al. | 357/42 |
| 4,326,210 | 4/1982 | Aso et al. | 357/22 B |
| 4,355,244 | 10/1982 | Benoit-Gonin et al. | 377/60 |
| 4,377,817 | 3/1983 | Nishizawa | 357/22 |
| 4,556,851 | 12/1985 | Levine | 377/60 |
| 4,562,474 | 12/1985 | Nishizawa | 357/30 H |
| 4,665,325 | 5/1987 | Yamada et al. | 357/24 LR |
| 4,684,968 | 8/1987 | Ohta et al. | 357/22 B |
| 4,689,808 | 8/1987 | Moorman et al. | 377/60 |
| 4,733,286 | 3/1988 | Matsumoto | 357/22 B |
| 4,809,307 | 2/1989 | Sakane et al. | 377/60 |
| 4,811,371 | 3/1989 | Tower | 377/60 |

OTHER PUBLICATIONS

SIT Image Sensor: Design Considerations and Characteristics-Atsushi Yusa et al-IEEE Transactions on Electron Devices-vol. ED-33, No. 6, Jun. 1986.

Primary Examiner—Andrew J. James
Assistant Examiner—Ngan Van Ngo
Attorney, Agent, or Firm—T. J. Cole; B. Peter Barndt; Richard L. Donaldson

[57] ABSTRACT

A floating gate junction filed-effect transistor image sensor element (10) is formed in a semiconductor layer (14). a drain region (20) of a first conductivity type of the elements (14) is formed adjacent a gate region (26). A potential barrier (98) is formed in the gate region (26) fo rcollecting carriers (102) of the second conductivity type, the barrier (98) also acting as a probing current well. A capacitor (28, 32, 48) is coupled to the gate region (26) and is operable to deliver a pulse to gate region (26) for sweeping out the carriers (102) to the substrate (12). The difference in gate bias voltage caused by the absence of the collected carriers (102) is sensed at a sense node (116) coupled to a source region (30).

19 Claims, 4 Drawing Sheets

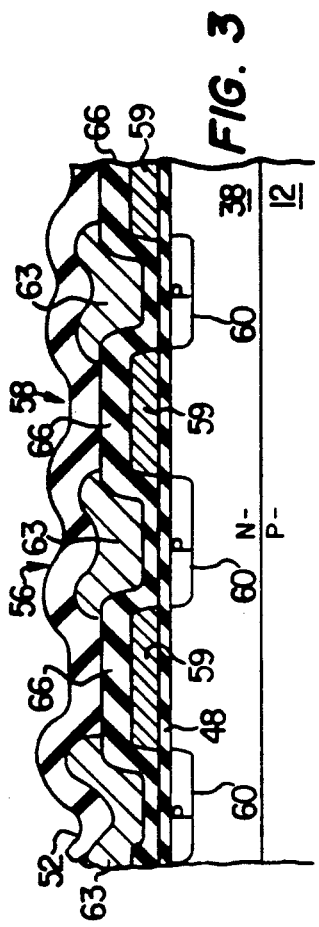
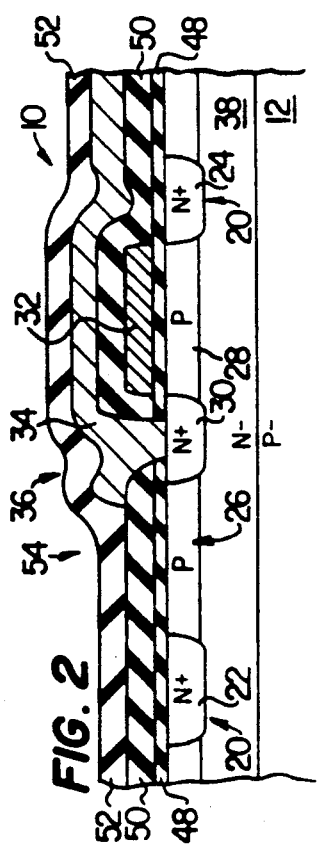
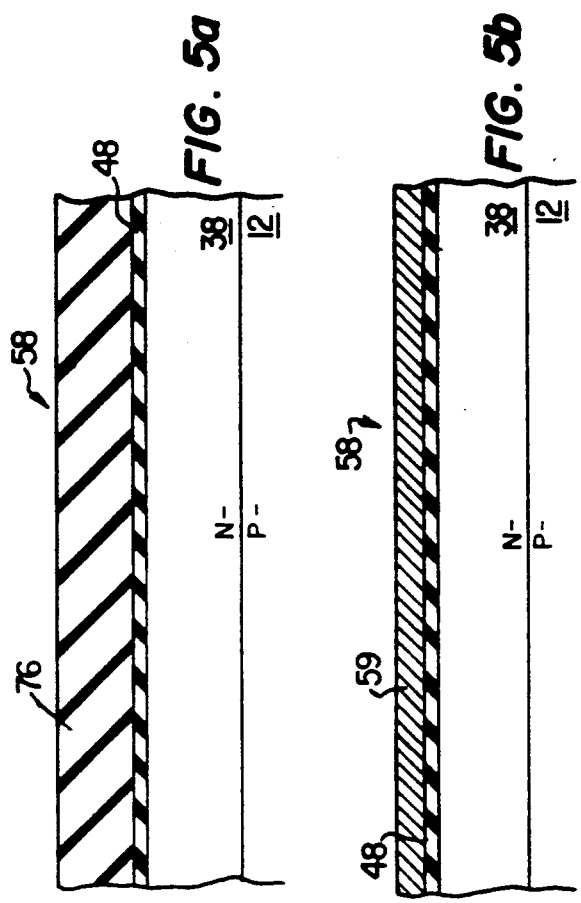
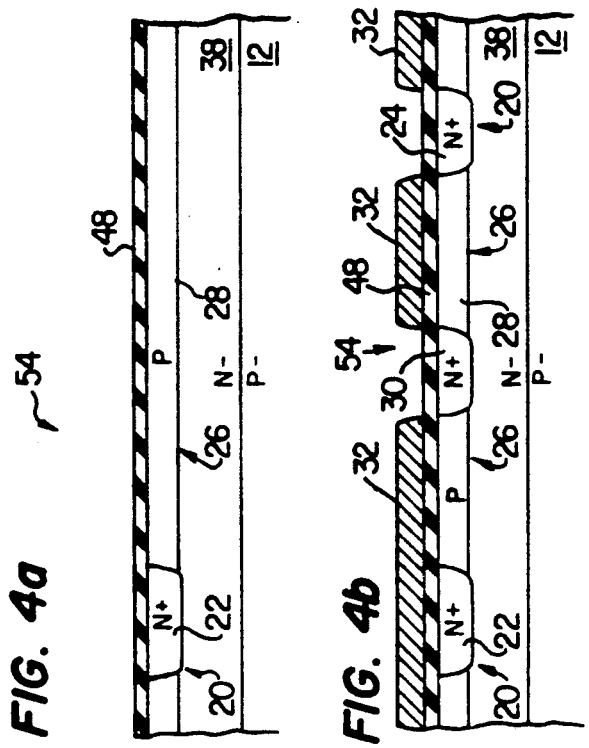

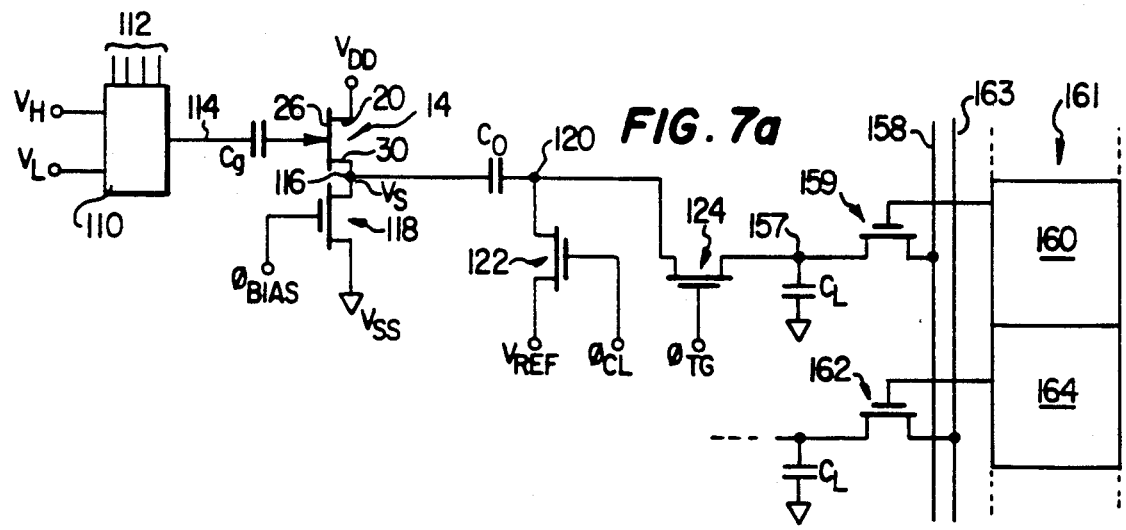
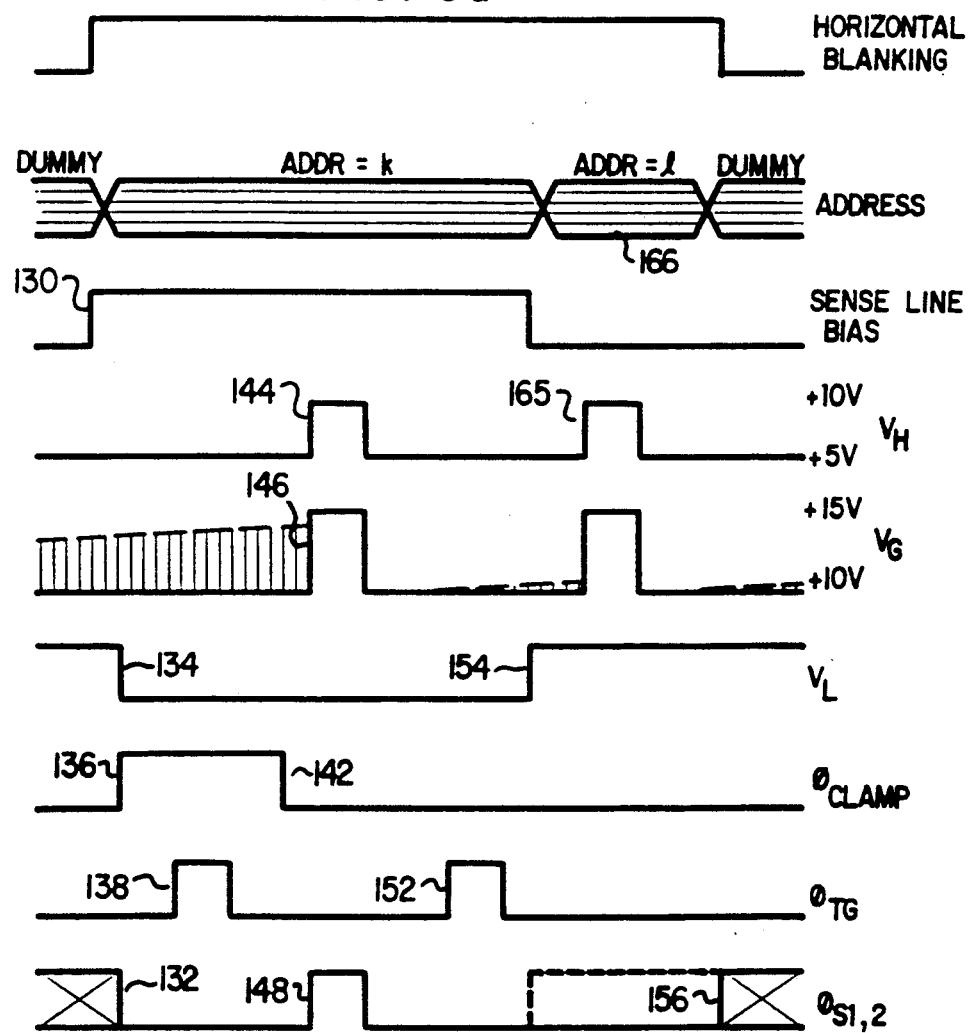

FLOATING GATE JFET IMAGE SENSOR

CROSS REFERENCE TO RELATED APPLICATIONS

The present application incorporated by reference each of the following applications which are related cases having a common inventor and assignee and which contain related subject matter: Ser. No. 033,968, filed Apr. 2, 1987, pending (TI-12270) Horizontal Scanner for Image Sensor Arrays; Ser. No. 037,302, filed Apr. 10, 1987, pending (TI-12271) Image Sensor Array; Ser. No. 036,617, filed Apr. 10,1987, pending (TI-12274) Bulk Charge Modulated Transistor and Method of Making Same.

This application is a continuation, of application Ser. No. 034,306, field on Apr. 3, 1987, now abandoned.

TECHNICAL FIELD OF THE INVENTION

This invention relates in general to image sensor elements, and more particularly relates to transistor image sensor elements that can be used to build imaging arrays with no measurable smear, built-in blooming protection, and electronic iris control.

BACKGROUND OF THE INVENTION

Several basic device architectures exist for constructing image sensor arrays. Two of these are the frame transfer and line-address architectures. These architectures generally have a plurality of CCD elements arranged in rows and columns. For each CCD photosite well, an additional well separated by a barrier needs to be fabricated adjacent to it for receiving the stored charge. Further, pixel density is decreased by the requirement of channel stops. In certain of these devices, drains are formed in the channel stops to prevent blooming, and this occupies further array area.

Another class of imagers is arranged according to the interline transfer architecture. These devices comprise a plurality of photosites that can be either empty CCD wells or photodiodes. The photosites are separated by columns of CCD elements provided for readout of the signal. The necessity for the CCD columns decreases pixel density. Channel stops and barriers are required since CCD elements are used in the structure, and this further decreases pixel density.

Yet another class of devices uses an X-Y architecture, wherein each cell or element is individually addressed in the X and Y direction in order to read it out. Conventional X-Y architectures include charge injection devices (CIDs), MOS transistor devices and, more recently, charge-modulated transistor devices. In the CID device, two gates are formed, one connected to a column line, and another connected to a row line. CID arrays have long readout leads, and therefore, have a large parasitic capacitance. This in turn lowers the dynamic range of the device because of the kTC noise associated with the long, high-capacitance readout lines. Further, since each cell is required to be separately read out, the readout of an entire row of cells takes a considerable time. The high-density television (HDTV) format requires that the addressing and readout of an image sensor array used in connection therewith be done within a standard 53.5-microsecond period. Thus, if there are 1000 elements in a row of a CID array device that is operated in the HDTV format, each element in the row must be addressed and read in 53.5 nanoseconds. This is very difficult to accomplish because of the RC time constant associated with charging up the readout lines, which in turn limits the size of CID image sensor arrays. Further, the relatively large time necessary to read out the array increases smear.

MOS transistor arrays have the same problems as CID arrays relative to their long, large-capacitance sense lines. In addition, the charge from each address element is not amplified, but is instead read out directly on these sense lines. Pixel density of these device arrays is reduced by the requirement of forming either one or two transistors at each photosite for addressing purposes.

Recently, a charge modulated device has been proposed by T. Nakamura, K. Matsumoto et al. in their article "A New MOS Phototransistor Operating in a Non-Destructive Readout Mode," *Japanese Journal of Applied Physics*, Vol. 24, No. 5, pp. L323–325 (May, 1985). This proposed sensor array has the same X-Y architecture as the CID and MOS architectures mentioned above, and thus suffers the same dynamic range and speed problems as the other X-Y addressed architectures.

A 53.5 ns readout time is difficult to meet by present polysilicide gate technology if the column sense lines of the array become too long.

X-Y addressed transistor imager pixels known in the art in general suffer from several other problems. A first drawback of certain conventional transistor imager pixels is that they have a gate region that is completely covered by an overlying, partially transparent or translucent conductor, conventionally fabricated of polysilicon. The presence of this overlying gate conductor reduces the quantum efficiency of the device.

Further, transistor imager element structures recently introduced in the literature modulate the current passing through them rather than sensing a voltage threshold modulation. This current will vary both with the intrinsic threshold voltage of the element producing it and also that element's size. Variations from element to element in these respects therefore produce "pattern noise." The threshold and size parameters of the sensing elements must therefore be tightly controlled; however, this control becomes progressively more difficult as the size of the element decreases.

The long readout time of conventional X-Y approach exacerbates such problems as smearing, blooming and element-to-element charge leakage from unaddressed rows to addressed rows.

A need therefore exists in the industry for a transistor sensor element that has good quantum efficiency, isolates itself with respect to adjacent imaging pixels, produces a modulated voltage signal rather than a current signal, has low pattern noise, and has a sufficiently fast readout for HDTV applications.

SUMMARY OF THE INVENTION

One aspect of the invention comprises a floating-gate junction field effect transistor sensor element. The element is formed at a surface of a semiconductor substrate or layer. A drain region of a first conductivity type is formed in the substrate, and is coupled to a voltage supply source. A gate region of a second conductivity type is formed in the semiconductor substrate laterally adjacent to the drain region. A potential barrier for collecting carriers of a second conductivity type is formed in the gate region at a substantial depth from the surface. The carriers are formed responsive to incident light. The barrier also acts as a probing current well for a probing current with carriers of the first conductivity type. A capacitor is coupled to the gate region for selectively delivering a pulse to the gate region for sweeping out the collected carriers into the substrate, which is of the second conductivity type.

A source region of the first conductivity type is formed in the semiconductor layer laterally adjacent the gate region and spaced from the drain region. The source region is coupled to a sense node and further to a constant current source for producing a probing current in the probing current well. It is preferred that the sensor element have an enclosing drain region, although other techniques for isolating adjacent elements from one another are possible.

Another aspect of the invention comprises a method for detecting light by an imaging element. For this method, the above structure of the invention is used. A supply voltage is supplied to the drain region, and a constant current source is supplied to the source region. Charge is accumulated in the gate region responsive to light incident thereon. This changes the bias voltage of the gate region. A changed source voltage is sensed at the sense node responsive to the changed gate region bias. The gate is then pulsed through a capacitor to sweep the charge accumulated therein to the substrate. The gate bias returns to its intrinsic value, and a normal source voltage is then sensed at the sense node.

Another aspect of the invention comprises a floating-gate junction field effect transistor image sensor array. The array is formed at a surface of a semiconductor substrate. A plurality of electrically connected, elongate, endless, enclosing drain regions of a first conductivity type are formed in the semiconductor layer to define a plurality of sensing elements arranged in rows and columns. Each drain region separates its respective sensor element from like adjacent elements. A gate region of each element are laterally enclosed by a respective drain region. The gate region is operable to erect a potential barrier for collecting carriers of a second conductivity type responsive to incident light. The barrier acts as a probing current well for a probing current of the first conductivity type.

A capacitor insulator layer is formed over each gate region. A continuous capacitor conductor is formed for each row of elements over the capacitor insulator layer that covers a portion of each gate region in the row. A source region of the first conductivity type for each element is formed in the layer and is laterally enclosed by a respective gate region.

A pulse applied to a selected capacitor conductor will sweep out carriers of the second conductivity type that are collected in each gate region in the respective row. The drain region of each element is coupled to a voltage supply. A continuous second conductor for each column of elements connects the source region of each element in the column to a sense node for sensing a change of the source voltage, and to a constant current source for providing current to the probing current wells in the column.

In another aspect of the invention, the drain region of each floating gate JFET transistor sensor element is formed from first and second elongate opposed spaced implanted portions that are separated by a respective gate region. The first portions are mask aligned to the rest of the structure.

The capacitor insulator layer extends over both the first and second drain region portions as well as over each gate region. The capacitor conductor layer for each row is formed to extend over the first portions of the drain regions and the gate regions of the row. The second portions of the drain regions are formed to join together ends of the respective first portions and produce enclosed drain structures. The second portions are self-aligned by laterally adjacent capacitor conductor layers. At the same time that the second portions of the drain region are implanted, the source region is also implanted, and is also formed in a self-aligned manner by the capacitor conductor layer. The capacitor conductor layer of each row is partially removed from over a portion of each gate region in the row and preferably from over parts of the first portions after this implantation step.

In another aspect of the invention, a CCD register used to store the sensed voltage signals is formed simultaneously with the imager array in the same semiconductor substrate.

In a further aspect of the invention, the CCD register may be replaced with other storage and readout means, such as an array of storage capacitors and a horizontal shift register scanner operable to connect at least a selected one of the storage capacitors to a respective output sense line.

BRIEF DESCRIPTION OF THE DRAWINGS

The various aspects of the invention and their advantages will be more completely understood by referring to the detailed description below, taken in conjunction with the appended drawings in which:

FIG. 2 is a highly magnified schematic sectional view of an image sensor element according to the invention, corresponding to section 2—2 of FIG. 1;

FIG. 3 is a highly magnified schematic cross-sectional view of a CCD output register fabricated on the same substrate with the image sensor element of the invention;

FIGS. 4a–4b are highly magnified schematic sectional views illustrating successive steps in a process of making an image sensor element according to the invention, the views corresponding to the view shown in FIG. 2;

FIGS. 5a–5b are highly magnified schematic sectional views illustrating successive steps in a CCD register fabrication process of the invention, the views corresponding to the view shown in FIG. 3;

FIG. 7a is a schematic electrical diagram of storage capacitors and horizontal scanner circuitry that may be used with the image sensor element of the invention in the place of the CCD register;

FIG. 8a is an alternate timing diagram, showing operation of the circuitry shown in FIG. 7 as an electronic iris.

DETAILED DESCRIPTION OF THE INVENTION

Figure 1:
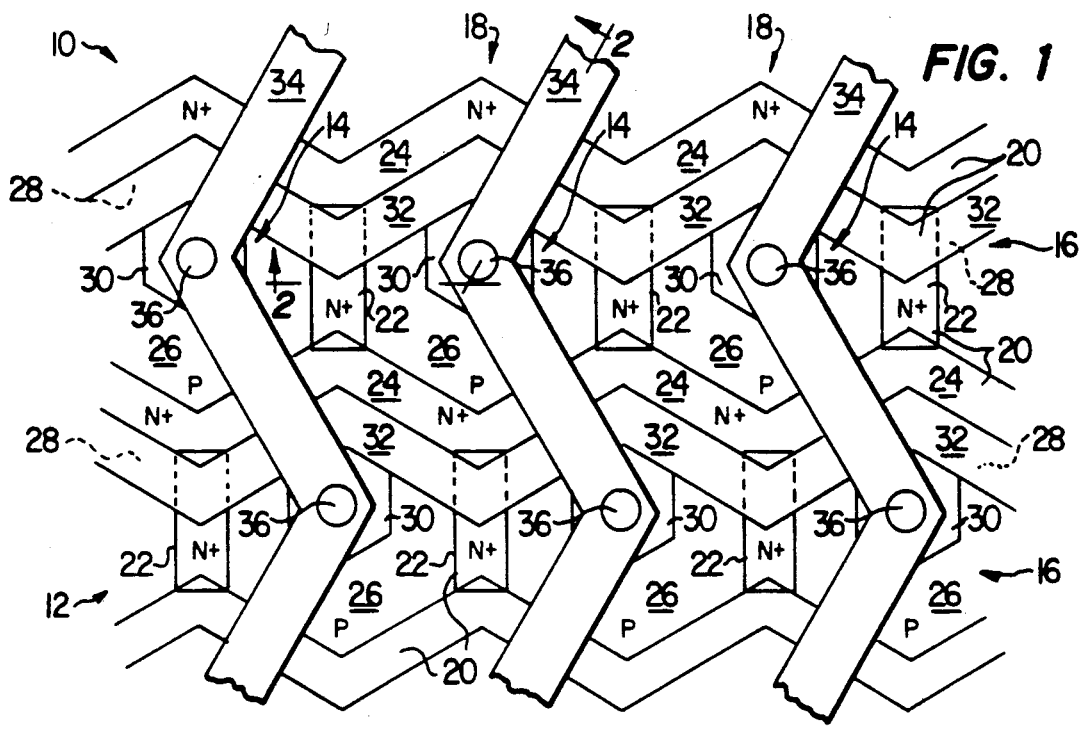
FIG. 1 is a highly magnified plan view of a fragment of an image array according to the invention, certain implanted regions being partially shown in phantom.

Referring first to FIG. 1, a highly magnified fragmentary plan view of an imager array according to the invention is shown generally at 10. Array 10 may be used and formed in conjunction with a CCD register, as will be described in conjunction with FIGS. 3, 5a–5b, and 7. Alternatively, array 10 may be used in conjunction with storage capacitors and a horizontal scanner, as will be described in conjunction with FIG. 7a. Array 10 is formed at a face of a (P−) semiconductor substrate or layer 12 and is comprised of a plurality of image sensor elements or pixels 14 arranged in a plurality of rows 16 and columns 18. As will be subsequently noted, the CCD register is formed on the same substrate as the array 10. Layer 12 is preferably a semiconductor substrate, but can also take the form of an epitaxial layer, or a semiconductor layer on an insulator base such as silicon-on-oxide.

Each sensor element 14 preferably has an enclosed architecture, although other, more complicated isolation techniques can be employed in fabricating a sensor element according to the invention. Each sensor element 14 has an elongate, endless, enclosing drain region 20 formed in substrate 12 that is heavily doped to be of the N conductivity type. All conductivity types herein described may be reversed; hence, drain regions 20 may be P+ as formed in an (N−) semiconductor layer 12, and all further elements of the structure would then have similarly reversed conductivity types. A preferred fabrication process detailing how array 10 is formed is described in conjunction with FIGS. 2 and 4a–4b.

Each endless drain region 20 is comprised of a pair of mask aligned, elongate, rectangular, opposed, spaced-apart portions 22 that are partly shown in phantom. Each drain region 20 further includes a pair of self-aligned opposed saw-toothed elongate second portions 24 that connect together the ends of portions 22 to make a plurality of enclosing, endless regions 20. The illustrated hexagonal structure of element 14 is preferred over other enclosing or endless structures, as closest packing of the sensor elements 14 can thus be achieved. However, for certain applications other configurations of drain regions may be utilized. Each drain region 20 not only operates as a drain of a respective element 14, but further operates to separate one such element 14 from adjacent elements 14.

Each element 14 further has a junction gate region 26 formed in the semiconductor substrate within drain region 20. A capacitor region 28 for each element is formed in substrate 12 as a portion of a respective gate region 26. Gate region 26 forms an endless enclosing structure, and in the illustrated embodiment forms an annular hexagon. In other embodiments, gate region 26 may form a circular annulus, an annular rectangle, or an annular octagon. An N+ source region 30 is formed in semiconductor substrate 12 so as to be spaced from drain region 20 and adjacent to gate region 26. Each source region 30 is preferably in the center of each element 14 and is laterally enclosed by gate region 26.

For each row 16, a continuous capacitor insulator (not shown in FIG. 1; described for FIG. 2 below) is formed on drain regions 20 and gate regions 26. The specifics of fabricating element 14 will be described in greater detail in conjunction with FIGS. 2 and 4a–4b.

For each row 16, a continuous capacitor conductor layer 32 is formed on the capacitor insulator layer over substrate capacitor regions 28, and parts of rectangular drain region portions 22. The capacitor insulator layer may be conveniently formed of silicon dioxide by oxidation of substrate 12, and capacitor conductor layer 32 may be formed of a relatively refractory, conductive, and preferably at least light-translucent material, such as doped polysilicon or doped tin oxide. The capacitor conductor layers 32 are formed over only portions of gate regions 26 to increase quantum efficiency.

A column conductor 34 is provided for each column 18 to connect source regions 30 in that column to a respective sense node (not shown; described for FIG. 7 below). Column conductors 34 and capacitor conductor layers 32 are spaced apart by a further insulating layer (not shown; see FIG. 2). Column conductors 34 may be formed of doped polysilicon, or more preferably, doped tin oxide. Column conductors 34 are connected to source regions 30 via contacts 36.

In the embodiment illustrated in FIG. 1, elements 14 in any one row 16 are linearly aligned, while the elements 14 in any one column 18 are offset from adjacent elements in the column by one-half pixel. In this configuration, resolution is increased, as there is thus closer packing of image sensor elements 14 in the array.

FIG. 2 is a highly magnified schematic cross-section of imager array 10, corresponding to line 2-2 of FIG. 1. FIG. 2 is not true to scale, and in particular is exaggerated in a vertical direction to show detail. A buried channel layer 38 is implanted and diffused into semiconductor substrate 12. Buried channel 38 is lightly doped to be (N−) type in the embodiment shown. Drain region portions 22 and 24 are doped N+, as shown. Source region 30 is also doped to be N+. Gate region 26 is differentially doped with a P-type dopant such that the potential profiles shown in FIG. 6 will be obtained when a bias voltage is applied to the element 14. This can be accomplished by introducing the P-type dopant to gate region 26 in a controlled, profiled doping concentration.

A capacitor insulator layer 48, which can conveniently be fabricated of oxide, is formed to extend over gate region 26 and drain region 20. A middle-level insulator layer 50 is formed to insulate capacitor conductor layer 32 from overlying conductors. Column conductor 34 is deposited over middle-level oxide layer 50. A final passivating insulative layer 52 is deposited on top of column conductor 34 and insulator layer 50. Additional steps necessary to complete the imager, such as metallization, have been omitted.

FIG. 3 is a schematic sectional diagram of a CCD output register 56 that is formed in the same semiconductor substrate 12 as array 10. As will be more particularly explained in conjunction with FIG. 7, the CCD register 56 is used to store charges converted from sensed voltage signals from array 10. Array 10 is formed in an active device area 54 (FIG. 2), and CCD register 56 is formed in an active device area 58. In device area 58 a plurality of spaced barriers 60 are formed in buried channel region 38. The illustrated register 56 is a two-phase CCD register. Each CCD gate comprises a first layer conductor 59 and a second-layer conductor 63. Conductors 59 are insulated from conductors 63 by a suitable insulator layer 66, which can be fabricated from oxide. The CCD register 56 is passivated by a passivating layer 52 that can also be formed of oxide. A further, opaque layer (not shown), which can be fabricated from a metal such as aluminum, is preferably deposited over layer 52 within active device area 58 to prevent incident light from interfering with CCD register 56's signal storage function.

FIGS. 4a–4b illustrate successive steps in a process for fabricating a floating gate junction field effect transistor array, as shown in FIG. 2. FIGS. 5a–5b illustrate corresponding steps in fabricating the associated CCD output register 56 shown in FIG. 3 in the same semiconductor substrate 12. Referring first to FIGS. 4a and 5a, an (N−) buried channel 38 is implanted in (P−) semiconductor substrate 12 in both array active device area 54 and register active device area 58. Phosphorus may be used as the implanted dopant, in which case the implantation concentration should range from $1.0 \times 10^{12}$ to $3.0 \times 10^{12}$ ions/cm$^2$ and the implantation energy should be in the range from 50 to 200 KeV. The (N−) diffusion drives the impurity deep into substrate 12. This can be done by subjecting substrate 12 to a temperature of about 1050° C. for about 24 hours under a nitrogen atmosphere.

Next, a thick field of oxide (not shown) is grown to define active device areas 54 and 58. Then, first, mask aligned portions 22 of drain regions 20 are patterned using photoresist (not shown), implanted, and annealed. Where drain regions 20 are N+, the dopant can be selected to be phosphorus, in which case the implantation concentration should range from $1.0 \times 10^{15}$ to $5.0 \times 10^{16}$ ions/cm$^2$ and the implantation energy should be in the range of 50 to 150 KeV.

A capacitor and CCD gate insulator layer 48 is thereafter grown in both device areas 54 and 58. Capacitor and gate insulator layer 48 is preferably formed of oxide, and may be grown from semiconductor substrate 12 to a thickness of approximately 600 Angstroms.

A new photoresist layer 76 is used to pattern a second implant into active device area 54. In this embodiment, the second implant is done with a P-type dopant such as boron at an ion concentration in the range from 2 to $6 \times 10^{12}$ ions/cm$^2$ and an implantation energy of 20 to 150 KeV. This provides a deep but only moderately doped gate regions 26 that is P-type.

Further fabrication steps of imager array 10 and CCD output register 56 are illustrated in FIGS. 4b and 5b. In the next major step, photoresist layer 76 is stripped from active device area 58. Capacitor conductor layer 32 is deposited, doped to be conductive, patterned and etched as shown. In the same step, a conductor layer 59 is likewise deposited and doped. Layers 32 and 59 can be polysilicon, in which case they may be doped in place by phosphoric oxytrichloride (POCl$_3$) to a sheet resistance of about 50 ohms/square. A preferred thickness of layers 32 and 59 is in the range from 3000 to 5000 Angstroms.

As shown, capacitor conductor layer 32 extends at this stage over capacitor region 28, gate region 26 and first mask aligned portions 22 of drain region 20. As thus disposed, layer 32 can be used for a self-aligned implantation step to form source region 30 and second, self-aligned portions 24 of drain region 20. Conductor layer 59 completely masks device area 58. This self-aligned implantation step can be done with an N-type dopant such as phosphorus. Where phosphorus is used, the implantation concentration should range from $1 \times 10^{15}$ to $5 \times 10^{16}$ ions/cm$^2$ and the implantation energy should fall in the range of 50 to 150 KeV. These implants are then annealed for a short time at an elevated temperature, such as 900° C. for 30 minutes.

Referring once again to FIGS. 2 and 3, the final stages in fabricating array 10 and register 56 according to the invention are illustrated. A portion of each capacitor conductor layer 32 that extends over gate regions 26 and parts of regions 22 is now patterned and etched, leaving the zigzag capacitor conductor layers 32 as shown in FIG. 1. Conductors 32 in fact define the location of underlying capacitor regions 28 within gate regions 26. Less than half of gate regions 26 will be covered by capacitor conductors 32. This increases the quantum efficiency of each element 14. Capacitor conductors 32 also cover up only those parts of mask aligned portions 22 necessary to form continuous conductors 32 for each row 16 (FIG. 1).

In the same step, layer 59 (FIG. 5b) is patterned and etched to form CCD conductors 59 (FIG. 3). Conductors 59 are subsequently used as a mask for the implantation of P-type dopant into active device area 58 to create P-type CCD barriers 60. Area 54 (FIG. 2) is masked with photoresist during this implantation.

In the next fabrication step, middle-level insulator layer 50 is deposited or otherwise formed over layers 48 and 32. An interelectrode insulator layer 66 is at the same time formed over layer 48 and electrodes 62 in register area 58. Then, source region contacts 36 are patterned and etched through capacitor gate insulator 48 and insulator layer 50. A second conductor layer 34 is next deposited, doped, patterned and etched to form column conductors 34 (see FIG. 1).

While conductors 32 and 34 may be formed of polysilicon, it is preferred that they be formed of tin oxide because of this material's superior light transmissivity. Layer 34 may first be deposited by a forced-plasma low-pressure chemical vapor deposition in a plasma reactor. Tetramethyltin and carbon dioxide can be used as the gas reactants in order to deposit layer 34. To render the tin oxide layer conductive, the reactant gas mixture can contain a small amount of phosphoric oxytrichloride (POCl$_3$) or phosphorous trichloride (PCl$_3$). The tin oxide layer 34 may be patterned using an oxide mask and etched using hydrogen iodide as entrained into the gas flow of an inert gas such as nitrogen. The etch should take place at a temperature below 450° C.

A further oxide layer 52 is deposited over oxide layer 50 and column conductor 34. In the peripheral areas of the chip, contacts are opened in oxide layer 52 to connect conductive layers 34, 32, 59 and 63 to appropriate peripheral circuitry. The contacts are preferably made with a metal such as aluminium.

In FIG. 3, conductors 63 are deposited, doped, patterned and etched simultaneously with column conductors 34, and preferably out of the same material. Column conductors 34 and clock conductors 63 are preferably deposited to a depth of approximately 5000 Angstroms, and are doped to have a sheet resistance of no more than 25 ohms/square.

Figure 6:
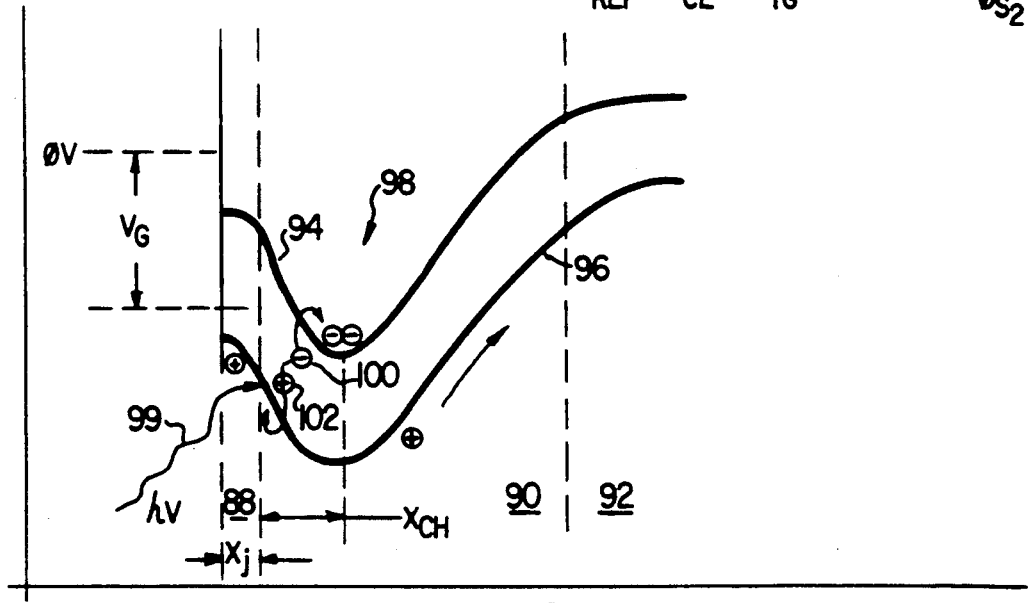
FIG. 6 is a potential band diagram of an image sensor element according to the invention.

Referring now to FIG. 6, a potential band diagram for the element of the invention is illustrated. The ordinate of the graph represents electric potential, and the abscissa represents the depth into the substrate. $V_g$ represents a bias voltage applied to the gate. A region 88 of the gate region having depth $X_j$ from the semiconductor surface is undepleted. Region 90 is a depleted region of the gate region that is adjacent undepleted region $X_j$. Electron-hole pairs are generated in the substrate, including region 90, responsive to incident light. A region 92 represents the undepleted substrate deeper than region 90.

A curve 94 is the plot of the conduction band potential in the gate region, and curve 96 is the valence band potential, for where bias voltage $V_g$ has been applied to the element and no charge has yet been accumulated by the gate region. Curves 94 and 96 are formed such that hole barrier 98, which also acts as an electron probing current well, is formed at a specific distance $X_j + X_{ch}$ beneath the surface.

If light 99 is permitted to enter the gate region, the gate region will generate electrons 100 and holes 102. The electrons will flow to probing current well 98, while the holes generated by light 99 will travel to one of two regions depending on the site of origination. If the electron hole pair is generated in the deeper region of depleted region 90 beyond barrier 98, the hole generated thereby will be lost to the undepleted substrate 92. On the other hand, if hole 102 is generated within regions $X_{ch}$ or $X_j$, it will travel toward the surface into region 88. As delimited by barrier 98, regions $X_j + X_{ch}$ act as a potential well for the collection of holes 102. Electrons 100 will add to the channel current, and since, as will be explained below, the JFET element is biased during operation with a constant current source, electrons 100 will be constantly swept out and will not produce any significant effect. Holes 102 on the other hand will be collected in the junction gate and will lower the threshold voltage of the gate region 26, and thus increase the positive bias $V_g$ of the JFET gate. This in turn will be sensed as an increase in the output voltage at the source region 30 (FIGS. 1 and 3).

The elements of the invention provide automatic blooming protection. As regions $X_j$ and $X_{ch}$ fill with holes, bias voltage $V_g$ increases, pushing down curves 94 and 96. However, after the gate bias is increased to the bias of the drain, electrons from the drain will fill probing current well 98 and fix its potential. Curves 94 and 96 will therefore flatten out in the $X_j$ and $X_{ch}$ regions, and probing current well 98 will no longer act as a barrier against newly collected holes escaping to the substrate. The previously collected holes are necessary to retain the flattening of curves 94 and 96, and therefore will be retained. However, further holes will automatically be swept into region 92. No further significant changes in the potential profile will be induced by increasing the hole generation rate.

Depth $X_{ch}$ must be selected to be deep enough to catch the holes generated by wavelengths of light toward the red end of the spectrum. Red light penetrates silicon more deeply than blue light. If electron hole pairs are generated by red light in the portion of region 90 deeper than $X_{ch}$, the holes generated thereby will be lost to undepleted substrate 92. Region $X_{ch}$ must therefore be deep enough for region 88 to capture as large a percentage of the holes generated by the red light as possible.

Figure 7:
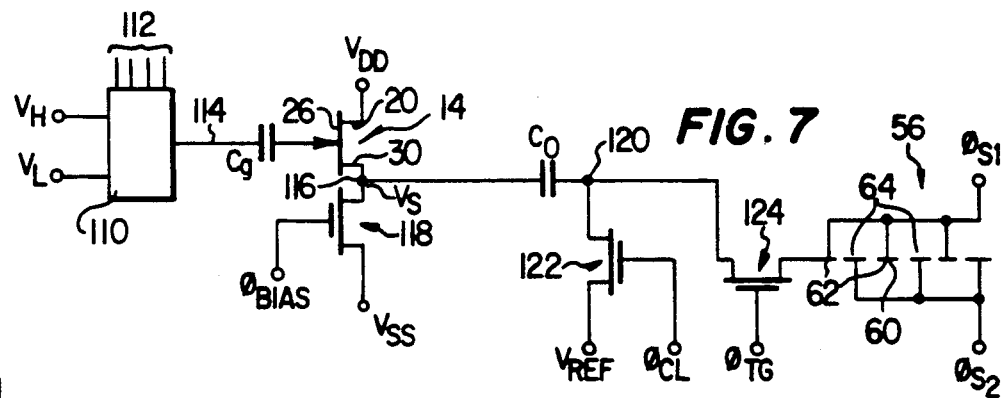
FIG. 7 is a schematic electrical diagram of an image sensor element and associated imager circuitry according to the invention.

Referring now to FIG. 7, a circuit for sensing the threshold voltage differential generated by an element 14 of the present invention is schematically shown. The elements in the circuit shown have been identified with the numbers of their structural equivalents as shown in FIGS. 1, 2 and 3 wherever possible.

A row decoder is indicated schematically at 110. Decoder 110 has a plurality of inputs 112, such as nine inputs, that carry decoder row line address information. Decoder 110 further has two voltage sources: a high array bias voltage $V_H$ and a low array bias voltage $V_L$. The address encoded into input 112 selects one particular row line 114 in the image sensor array. Voltage source $V_H$ is connected to the selected row line 114, while voltage source $V_L$ is connected to the other, unselected row lines in the array.

One sensor element in a selected row is indicated generally at 14. Element 14 has a drain 20 that is connected to a supply voltage source $V_{DD}$; a gate region 26 connected to a capacitor $C_g$; and a source region 30 that is connected to a sense node 116. The selected row line 114 is connected to capacitor $C_g$. Capacitor $C_g$ corresponds to capacitor conductor layer 32, capacitor insulator layer 48 and a capacitor region 28 for one selected element in FIGS. 1 and 2. Capacitor $C_g$ is in turn connected to gate 26.

A sense node 116 is connected to source 30 and the drain of a bias transistor 118. Transistor 118 has a gate controlled by a pulse source $\phi_{bias}$. The source of transistor 118 is connected to a reference voltage $V_{ss}$.

Sense node 116 is further connected to a coupling capacitor $C_o$. Capacitor $C_o$ is in turn connected to a node 120. Node 120 is connected to the drain of a clamping transistor 122. The source of clamping transistor 122 is connected to a reference voltage $V_{REF}$, and its gate is connected to a source of clamping clock $\phi_{cl}$. Node 120 is further connected to a first end of the current path of a transfer gate transistor 124. Transfer gate transistor 124 has a gate controlled by a transfer gate clock $\phi_{TG}$. The second end of the current path of transistor 124 is connected to an input diode of CCD register 56, which in the illustrated embodiment is a two-phase CCD register. CCD register 56 has a first clock source $\phi_{s1}$ and a second clock source $\phi_{s2}$. Clock sources $\phi_{s1}$ and $\phi_{s2}$ control alternating gates 62 and 64, which in turn control the disposition of the stored signal charge inside register 56.

Figure 8:
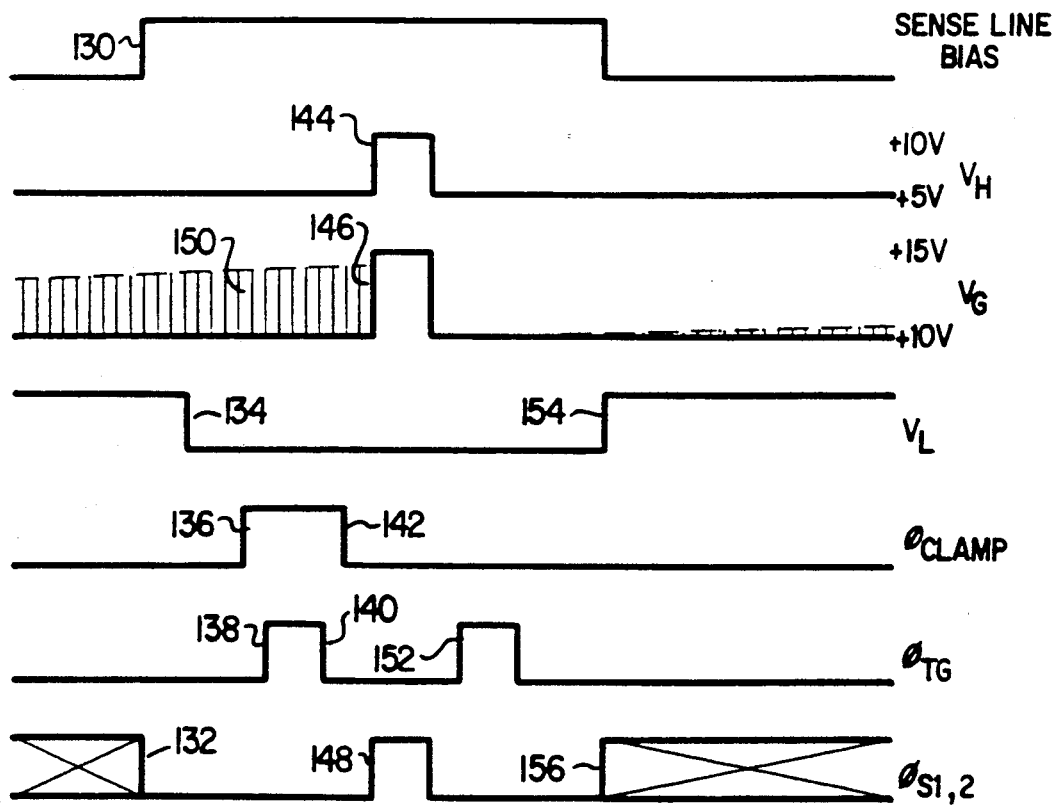
FIG. 8 is a timing diagram for the operation of the circuitry shown in FIG. 7.

The operation of the circuit of FIG. 7 will now be described with the aid of the timing diagram shown in FIG. 8. The operation of the selected element 14 occurs, as applied to a standard TV timing sequence, entirely within a horizontal blanking period. Since elements 14 are read out in parallel, the array of the invention is suitable for HDTV applications. A major problem in conventional imager arrays is the smear caused by the long readout time for any one row of elements. Reading out an entire row at one time in parallel to a register minimizes the smear problem.

First, the sense line bias transistor 118, which was off to save power, is turned on at 130. At or near this time, the horizontal readout phase ends, as indicated on the $\phi_{s1,2}$ readout at 132. This is where the horizontal blanking time starts.

Next, the decoder 110 connects the selected line 114 to the $V_H$ array bias, and connects the non-selected lines to the $V_L$ bias at 134. This prevents signal interference from non-selected elements.

Since the last charge elimination pulse (described below), charge has accumulated in gate region 26, decreasing the threshold voltage by a variable factor $V_h$ that depends on the number of holes collected. This causes $V_G$ to increase, as shown at 150, and will correspondingly cause the voltage at node 116 (FIG. 7) to rise from a bias source voltage $V_s$ to $V_s + V_h$.

Transistor 122 is next turned on by $\phi_{clamp}$ at 136. This establishes a reference voltage, such as five volts, on the right side of capacitor $C_o$ at node 120. The reference voltage $V_{REF}$ should be chosen according to the optimum charge input level necessary for the CCD register. After several RC time constant periods of the sense line between node 116 and capacitor $C_o$, the voltage on node 116 or on the left side of capacitor $C_s$ will be equal to $V_s + V_h$. The voltage across capacitor $C_s$ will therefore be equal to $(V_s + V_h) - V_{REF}$.

The charge corresponding to the reference voltage $V_{REF}$ is put into the CCD register 56 by pulsing the transfer gate transistor 124 at time 138. Transfer gate transistor 124 is turned off at 140. Clamping transistor 122 is turned off at 142, allowing the voltage at node 120 to float.

Next, region 88 (FIG. 6) is emptied of collected holes by pulsing the $V_H$ array bias high at 144. Pulse 144 is applied to sensor gate 26 through capacitor $C_O$. This will cause the gate bias $V_g$ to rise as shown at 146. Simultaneously, the reference charge is transferred from the first CCD register 56 to a parallel CCD register (not shown) by a pulse of a second transfer gate (not shown) at 148. The loss of holes from the gate region will cause the threshold voltage to increase by $V_h$ to $V_t$, and this will be reflected by a lower, normal source voltage $V_s$ at node 116. The voltage across capacitor $C_s$ must however remain the same, and thus the voltage at node 120 will be equal to $(V_{REF} - V_h)$, mirroring the drop in voltage at node 116. A signal is thus available at node 120 that is entirely independent of the intrinsic threshold voltage of element 14, and pattern noise due to variations in $V_s$ or the threshold voltage from element to element is therefore eliminated.

To store the $(V_{REF} - V_h)$ signal, transfer gate transistor 124 is pulsed by $\phi_{TG}$ at 152. This transfers the signal voltage into CCD register 56. $V_L$ goes high at 154. The horizontal blanking period ends at 156.

By the above sensing process, both the reference voltage and the signal voltage are input to the CCD register through the same input node. A further source of pattern noise is thereby minimized. The described timing sequence is only an example, and other possibilities exist. For example, the $\phi_{T6}$ pulse at 138 can occur after $\phi_{clamp}$ goes down at 142.

Other means for storage can be employed with the array of the invention. One such alternative means is illustrated by FIG. 7a, which is a schematic electrical diagram of an array of storage capacitors and a horizontal scanner stage that replaces CCD register 56. As before, a transfer gate 124 is operable to transfer the signal from node 120 responsive to a transfer gate pulse $\phi_{TG}$. The charge is however transferred to a storage capacitor $C_L$ rather than an input node of a CCD register. Capacitor $C_L$ is connected between a node 157 and a voltage reference such as ground. Node 157 is connected to a first output sense line 158 by the current path of a switching transistor 159. The gate of switching transistor 159 is connected to a stage 160 of a horizontal scanner indicated generally at 161. In an adjacent column, another capacitor $C_L$ is connected via a switching transistor 162 to a second sense line 163. The gate of switching transistor 162 is controlled by a stage 164 of scanner 161 that is preferably adjacent stage 160. Clock inputs (not shown) are input into stages 160 and 164 in order to respectively actuate switching transistors 159 and 162. In the illustrated embodiment, different clock sources are used to simultaneously clock adjacent stages 160 and 164 in order to simultaneously read out charge stored on adjacent storage capacitor $C_L$ onto sense lines 158 and 163. Alternatively, a single sense line connected to all columns can be employed, in which case stages 160 and 164 are clocked sequentially by a single clock source. Other variations, such as multiple output sense lines, are possible.

FIG. 8a is a timing diagram showing how the array of the invention can be used for automatic exposure control, or an "electronic iris". This effect will be obtained if the charge accumulation time afforded each gate region 26 is reduced. If a charge elimination pulse 165 is applied to gate region 26 (FIG. 1) at an earlier time, there will be less opportunity for charge to be accumulated responsive to incident light.

To do this, a second addressed row line l is selected at 166 within the same horizontal blanking period, where address l is a number of lines removed from address k. Address k is the address of the sense element which is presently being read. A charge elimination pulse 165 is applied to all gate regions 26 in row l but no signals are transferred to CCD register 56 (FIG. 7) for this row. If there are, for example, 525 lines, and the normal TV line period is t, the normal charge accumulation time will be approximately 525t and will correspond to a wide open mechanical iris. If, on the other hand, an additional address l is chosen that precedes address k by a selected number of row lines from address k, the new charge integration time will be $(525 - (k - l))t$. This will give a correspondingly shorter integration time, which corresponds to a partially closed mechanical iris.

Figure 9:
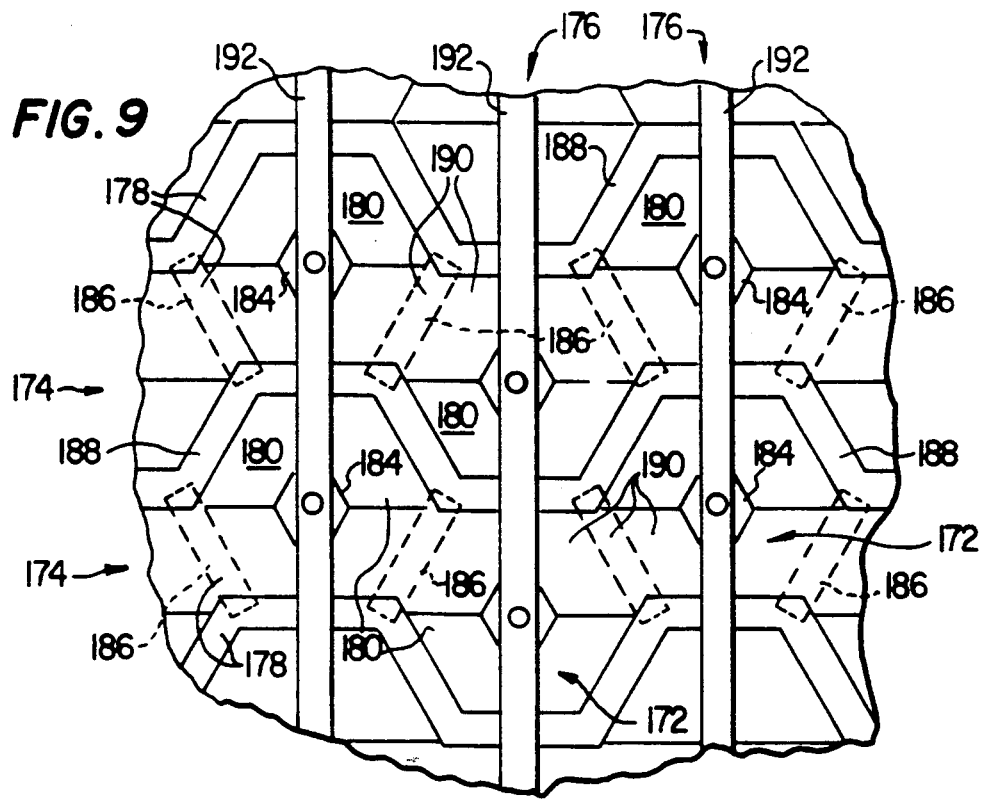
FIG. 9 is a highly magnified plan view of an alternate embodiment of an image sensor array according to the invention.

Referring now to FIG. 9, a highly magnified plan view of an alternate embodiment of an array according to the invention is illustrated.

An alternate array is indicated generally at 170. Array 170 is comprised of a plurality of elements 172 that are, like the array shown in FIG. 1, arranged in a plurality of rows 174 and columns 176.

Each element 172 has an endless or enclosing drain region 178 enclosing a gate region 180. Gate region 180 in turn encloses a source region 184. The operational characteristics of drain regions 178, gate regions 180, and source regions 184 are the same as those shown in the array in FIG. 1.

Each drain region 178 has rectangular, spaced mask aligned portions 186, corresponding to portions 22 in FIG. 1, and self-aligned portions 188 that correspond to self-aligned portions 24 in FIG. 1. The mask aligned portions 186 of drains 178 are preferably in the form of rectangular sides of an annular hexagon, the sides being 120° removed from each other, rather than 180° removed from each other as in FIG. 1. The self-aligned portions 188 take a somewhat crenelated form as shown, rather than the zig-zag form of their counterparts 24 shown in FIG. 1.

For each row 174, a continuous capacitor conductor 190 is insulatively formed over a portion of each gate region 180 in the row, and parts of all mask aligned portions 186 in the row. Capacitor conductors 190, before being etched away from covering gate regions 180 and the remaining parts of portions 186, are used to self-align portions 188 and sources 184.

A column conductor 192 is provided for each column 176, and takes the form of a straight bar, providing a process advantage. Column conductor 192 is serially connected to each source region 184 in its column 176.

Another modification of the array as shown in FIG. 1 may be made that is particularly suited for an interlaced readout operation. According to this alternative embodiment (not shown), the zigzag second conductors 34 are replaced with straight, vertical conductors that are each connected to a sensor element in every other row. A second set of source region conductors is used to connect to the source regions that were not connected by the first set.

In summary, a novel sensor element has been disclosed that operates on the principle of a floating gate junction field effect transistor. Since no other gate electrode beside the capacitor electrode is necessary to cover the gate region, the quantum efficiency of the sensing element is increased over conventional elements. A source voltage component caused by accumulated charge due to incident light is sensed that is independent of the intrinic threshold voltage of the element. Further, the enclosed geometry of the sensing element obviates the necessity for non-functional channel stops or the like. The element eliminates several sources of pattern noise, and is suitable for HDTV applications. The sensor element minimizes blooming by automatically dumping excess holes to the substrate, and is read out in parallel within a very short time to a buffer such as a CCD register. The signal is thereafter read out from the buffer. Smear is thereby essentially eliminated. A novel array incorporating the sensor element of the invention has been disclosed that has a high cell packing density and has electronic iris capability.

While preferred embodiments of the invention and their advantages have been described in the above detailed description, the invention is not limited thereto but only by the scope and spirit of the claims which follow.

TECHNICAL ADVANTAGES OF THE INVENTION

A principal advantage of the invention is its high quantum efficiency relative to conventional transistor sensor elements that require their gate regions to be covered by a conductor. Another advantage of the invention is provided by its enclosed structure, wherein such structures as channel stops are not necessary. A further advantage of the invention results from the fact that the circuitry thereof senses a change in threshold voltage, rather than a modulation in current. Intrinsic threshold voltage and size-of-element pattern noise have been eliminated. Another advantage of the invention is its use of tin oxide for overlaying conductors, a material that has higher transmissivity than conventional polysilicon. Many portions of the array of the invention may be fabricated using a self-aligned process, thereby assuring greater quality control. The invention further has good sensitivity to red wavelengths. Another advantage results from the ability of the sensing cycle of the invention to conform to a conventional horizontal blanking period in HDTV applications.

An array fabricated using the element of the invention has an electric iris capability or automatic exposure control, such that the need for a mechanical iris is eliminated. The array further minimizes smear since all array elements in a particular row are read out in parallel during the horizontal blanking period and then stored in a buffer, such as a CCD register or capacitor array, to be later sensed during a normal TV readout period. A further advantage of the invention is the provision of a sensor element that has automatic blooming protection.

What is claimed is:

1. A floating gate junction field effect transistor light sensor element comprising:
   a semiconductor substrate of a first conductivity type;
   a fist semiconductor region of a lightly doped second conductivity type formed on said substrate;
   a second semiconductor region of a heavily doped second conductivity type formed in said first semiconductor region;
   a third semiconductor region of a first conductivity type formed in said first semiconductor region as a first annular region about said second semiconductor region, said third semiconductor region capacitively coupled to a source of bias voltage to provide a potential well for accumulating first charge carriers generated in said third semiconductor region by light incident upon said third semiconductor region.
   a fourth semiconductor region of a heavily doped second conductivity type formed in said first semiconductor region as a second annular region about said third semiconductor region;
   a capacitor region partially overlaying said third and said fourth semiconductor regions and conductively connected to said source of bias voltage to selectively apply a voltage pulse to said third semiconductor layer and sweep said first charge carriers out of said potential well; and
   a conductor region conductively connected to said second semiconductor region to sense a change in potential of said second semiconductor region resulting from said accumulation of said first charge carriers in said potential well in said third semiconductor region.

2. The light sensor element of claim 1 in which said second semiconductor region (30) is a hexagonal shaped region.

3. The light sensor element of claim 1 wherein said third semiconductor region (26) is formed as a first annulus about said second semiconductor region (30) and the fourth semiconductor region (20,22,24) is formed as a second annulus about the third semiconductor region (26).

4. The light sensor element of claim 1 in which said capacitor region includes a capacitor layer overlying a first insulating layer, said first insulating layer overlaying said third and fourth semiconductor regions.

5. The light sensor element of claim 1 in which said first conductivity type is p-type material and said second conductivity type is n-type material.

6. The light sensor element of claim 1 in which said first conductivity type is n-type material and said second conductivity type is p-type material.

7. The light sensor element of claim 5 wherein said first charge carriers are holes.

8. The light sensor element of claim 6 wherein said first charge carriers are electrons.

9. A junction field effect transistor forming a light sensing element comprising:
   a semiconductor substrate (12) of a first conductivity type;
   a first semiconductor region (38) of a lightly doped second conductivity type formed on said substrate;
   regions of heavily doped second conductivity type formed in said first semiconductor region (38) and constituting respective source (30) and drain (20,22,24) regions, said drain region spaced from and laterally enclosing said source region;
   a floating junction gate region (26) of a first conductivity type formed in said first semiconductor region (38) between said source region (30) and said drain region (20,22,24), to laterally enclose said source region, sad floating junction gate region capacitively coupled to a source of bias voltage via a capacitor region to provide a potential well for accumulating first charge carriers generated in said floating junction gate region;

said capacitor region (32,48) partially overlaying said drain region (20,22,24) and said floating junction gate region (26) and conductively connected to said source of bias voltage to selectively apply a voltage pulse to said floating junction gate region (26) and sweep said accumulated first charge carriers out of said potential well; and a conductor region (34,50,52) conductively connected to said source region to sense a change in potential in said source region resulting from the accumulation of the first charge carriers in the potential well in said floating junction gate region (26).

10. The light sensor element of claim 9 wherein said first conductivity type is p-type material and said second conductivity type is n-type material.

11. The light sensor element of claim 9 wherein said first conductivity type is n-type material and said second conductivity type is p-type material.

12. The light sensor element of claim 9 wherein said capacitor region includes a capacitor layer overlaying a first insulating layer, said first insulating layer overlaying said drain region and said floating junction gate region.

13. A floating junction gate junction field effect transistor light sensor array comprising:

a semiconductor substrate of a first conductivity type;

a first semiconductor region of a lightly doped second conductivity type formed on said substrate;

a plurality of spaced apart regions of a heavily doped second conductivity type formed in said first semiconductor region;

a plurality of first annular regions of a first conductivity type formed laterally in said first semiconductor region about respective spaced apart regions, said first annular regions capacitively coupled to a source of bias voltage via a capacitor region to provide a plurality of potential wells for accumulating first charge carries generated in said plurality of first annular regions produced by light incident upon said first annular regions;

a plurality of second annular regions of a heavily doped second conductivity type formed laterally in said first semiconductor region about respective ones of said first annular regions, said second annular regions forming an interconnected planar annular array in said first semiconductor region electrically isolating respective first annular regions from each other;

said capacitor region partially overlaying said plurality of first and second annular regions and conductively connected to said source of bias voltage to selectively apply a voltage pulse to said plurality of first annular regions and sweep said accumulated first charge carriers out of the plurality of potential wells; and a plurality of conductor regions conductively connected to said spaced apart regions to sense a change in potential of said spaced apart regions resulting from the accumulation of the first charge carriers in the potential wells in said first annular regions.

14. The light sensor array of claim 13 wherein said plurality of spaced apart regions are hexagonally shaped.

15. The light sensor array of claim 13 wherein said capacitor region includes a capacitor layer overlaying a first insulating layer, said first insulating layer overlaying said first and second annular regions.

16. The light sensor array of claim 13 wherein said first conductivity type is p-type material and said second conductivity type is n-type material.

17. The light sensor array of claim 13 wherein said first conductivity type is n-type material and said second conductivity type is p-type material.

18. The light sensor array of claim 16 wherein said first charge carriers are holes.

19. The light sensor array of claim 17 wherein said charge carriers are electrons.

* * * * *